United States Patent [19]
Huang

[11] Patent Number: 5,672,534
[45] Date of Patent: Sep. 30, 1997

[54] PROCESS FOR FABRICATING CAPACITOR CELLS IN DYNAMIC RANDOM ACCESS MEMORY (DRAM) CHIPS

[75] Inventor: Heng-Sheng Huang, Taipei, Taiwan

[73] Assignee: United Microelectronics Corporation, Hsinchu, Taiwan

[21] Appl. No.: 644,201

[22] Filed: May 10, 1996

[51] Int. Cl.⁶ .................. H01L 21/70; H01L 27/00
[52] U.S. Cl. .................. 437/52; 437/60; 437/919
[58] Field of Search .................. 437/47, 52, 60, 437/919; 257/306–308

[56] References Cited

U.S. PATENT DOCUMENTS

| 4,742,018 | 5/1988 | Kimura et al. | 437/52 |
| 5,284,787 | 2/1994 | Ahn | 437/52 |
| 5,422,295 | 6/1995 | Choi et al. | 437/52 |

*Primary Examiner*—Jey Tsai
*Attorney, Agent, or Firm*—Cushman Darby & Cushman IP Group of Pillsbury Madison & Sutro, LLP

[57] ABSTRACT

Disclosed is a process for fabricating capacitor cells in DRAM chips allowing the capacitor cells thus fabricated to have higher capacitance by providing a stacked fin-like structure. The process comprises the following steps of: (1) forming on a substrate a field oxide layer, transistor cell, and insulation layer having a contact opening; (2) forming a stacked structure consisting of a plurality of alternately formed first polysilicon layers and insulation spacers; (3) forming an opening through the first polysilicon layers and insulation spacers in the stacked structure by etching; (4) etching away portions of the first polysilicon layers that are exposed on the inner wall of the opening so as to form a plurality of grooves in the opening; (5) forming a second polysilicon layer to the inner wall of the opening so as to cover the grooves; (6) defining a range for the capacitor cell by etching the second polysilicon layer and the first polysilicon layers and insulation spacers in the stacked structure, whereby part of the second polysilicon layer that is connected to each of the first polysilicon layers in the stacked structure serves as a bottom plate for the capacitor cell; (7) removing each of the insulation spacers in the stacked structure whiling retaining the bottom plate; (8) forming a dielectric layer covering the bottom plate; and (9) forming a third polysilicon layer covering the dielectric layer to serve as a top plate for the capacitor cell.

7 Claims, 4 Drawing Sheets

PROCESS FOR FABRICATING CAPACITOR CELLS IN DYNAMIC RANDOM ACCESS MEMORY (DRAM) CHIPS

BACKGROUND OF THE INVENTION

1. Field of the Invention

The present invention relates to semiconductor fabrication processes for fabricating dynamic random access memory (DRAM) chips, and more particularly, to a process for fabricating charge-storage capacitor cells in DRAM chips. Characteristically, a capacitor cell is formed with a multi-layer of polysilicon in the shape of fins such that the capacitance thereof is increased due to increase in surface area.

2. Description of Related Art

Dynamic random access memory (DRAM) is the most widely used semiconductor storage device on computers and any microprocessor-based systems that require volatile memory for temporary storage of data. DRAMs containing a million bits (megabits) of data are being now produced. Nevertheless, there is still desired DRAMs with greater storage capacity. Therefore research continues to be carried out in the semiconductor industry to develop DRAMs in which feature size is reduced so as to increase the packing density while retaining high performance characteristics.

Presently, there is proposed a new technique to increase the pacing density of DRAMs. Each memory cell is constructed with a single transistor connected in series to a capacitor instead the more conventional arrangement of three transistors. This simplification in the memory cell significantly increases the packing density. However, using this technique requires that the capacitor have a high capacitance for reliably retaining the charge stored thereon.

FIGS. 1A–1B (Prior Art) are schematic cross-section views showing steps of a conventional process for fabricating a capacitor cell based on a stacked structure in DRAM chip. As shown in FIG. 1A (Prior Art), the structure is built on a silicon substrate 10. On substrate 10 a field oxide layer 11 is formed using a conventional method to define the active area. Next, a transistor serving as memory cell is formed. Reference numeral 12 represents the gate of the transistor. A silicon dioxide layer 13 is then formed on the gate layer 12. A contact opening 18 is formed by etching. Subsequently, a polysilicon layer 14 is deposited on the silicon dioxide layer 13 and which fills up the contact opening 18. The polysilicon layer 14 is coupled to the silicon substrate 10 via the contact opening 18 and is implanted with impurities to increase its conductivity. Next, a microlithographic process and an etching process are successively performed to define a pattern on the polysilicon layer 14 so as to form a bottom plate for the capacitor cell.

Next, as shown in FIG. 1B (Prior Art), a dielectric layer 15 is formed on the polysilicon layer 14 that serves as the bottom plate for the capacitor cell. The dielectric layer 15 thus formed is a three-layer ONO structure consisting of a silicon oxide layer (O), a silicon nitride layer (N), and a silicon oxide layer (O). In the process for forming the dielectric layer 14, heat treating is carried out to allow impurities in the polysilicon layer 14 to be diffused through the contact opening 18 into the silicon substrate 10, thereby forming a contact region 17 on the silicon substrate 10. Finally, another polysilicon layer 16 is formed on the dielectric layer 15 to serve as top plate for the capacitor cell. The capacitor cell is thus formed.

The capacitance of the capacitor cell is proportional to the size of its top and bottom plates. However, as packing densities increase, feature sizes of the individual components gets smaller. This tends to reduce plate area of the capacitor and capacitance becomes less. Eventually, this leads to insufficient capacitance for reliable storage of electric charges that represent data. In order to increase the capacitance, two approaches are feasible: one is to reduce the thickness of the dielectric layer 15, and the other to increase the area of the bottom plate, i.e., the polysilicon layer 14.

In the first approach, there is a limit to the reduction of the thickness of the dielectric layer 15. If the thickness of the dielectric layer 15 is less than 50 Å, the dielectric layer 15 could be subject to direct carrier tunneling which causes excessive leakage current to the DRAM chip. This would severely affect the characteristics of the DRAM chip thus made. Therefore, most research efforts are directed to the second approach, trying to increase the area of the top and bottom plates for the capacitor cell.

A result of such efforts is the formation of a "trenched" capacitor cell, in which the silicon substrate is formed with deep grooves on lateral sides of the transistor. These deep grooves allow the capacitor cell then formed to have a greater plate area, thus increasing capacitance. However, it is still a drawback of the trenched capacitor cell that the etching rate is affected as the aspect ratio of the grooves increases, which would significantly affect production efficiency. Moreover, lattice defects will unavoidably occur during the forming of the grooves by etching, thus causing leakage current that would affect the characteristics of the DRAM chip. Accordingly, DRAMs based on trenched capacitor cells are only made for academic research purposes and not suitable in mass production for commercial purposes.

Many other proposals teach a stacked structure for forming the capacitor cell, in which the morphology of the surfaces of the capacitor plates are to be made in such a way as to increase the area of the capacitor plates. Among them, Ema et al teach a "Fin Type Stacked Capacitor" based on a paper entitled "3-Dimensional Stacked Capacitor Cell for 16M and 64M DRAMs" and published in *International Electron Devices Meeting*, pp. 592–595. However, it is still a drawback of these teachings that although higher capacitance is achieved, the problem of insufficient capacitance still arises when the DRAM chip is further miniaturized. Moreover, most of the teachings involve complicated and costly processes to achieve, which make them not suitable for use in mass production for commercial purposes.

SUMMARY OF THE INVENTION

It is therefore a primary objective of the present invention to provide a process for fabricating a capacitor cell in DRAM chips which allows the capacitor cell to have a higher capacitance without changing the feature size of the DRAM chips.

In accordance with the foregoing and other objectives of the present invention, there is provided with a new and improved process for fabricating a capacitor cell in DRAM chips. The process comprises the following steps of:

forming on a substrate a field oxide layer, a transistor cell, and an insulation layer having a contact opening;

forming a stacked structure including a plurality of first polysilicon layers and insulation spacers alternately formed on the insulation layer;

implanting impurities in the bottom-most polysilicon layer in the stacked structure to increase its conductivity, the bottom-most layer being coupled to the substrate via the contact opening;

forming an opening through the plurality of first polysilicon layers and insulation spacers in the stacked structure until reaching the bottom-most polysilicon layer by etching;

wet etching away portions of the plurality of first polysilicon layers that are exposed on the inner wall of the opening so as to form a plurality of grooves in the opening;

forming a second polysilicon layer to the inner wall of the opening so as to cover the plurality of grooves formed thereon;

defining a range for the capacitor cell by etching the second polysilicon layer and the plurality of first polysilicon layers and insulation spacers in the stacked structure, whereby part of the second polysilicon layer that is connected to each of the first polysilicon layers in the stacked structure serves as a bottom plate for the capacitor cell;

removing each of the insulation spacers in the stacked structure whiling retaining the bottom plate;

heat treating to form a dielectric layer covering the bottom plate and also to allow the impurities in the bottom-most polysilicon layer in the stacked structure to be diffused through the contact opening to the substrate so as to form a contact region in the substrate; and forming a third polysilicon layer covering the dielectric layer to serve as a top plate for the capacitor cell.

BRIEF DESCRIPTION OF DRAWINGS

The present invention can be more fully understood by reading the subsequent detailed description of the preferred embodiments thereof with references made to the accompanying drawings, wherein.

DETAILED DESCRIPTION OF A PREFERRED EMBODIMENT

Figure 2A:
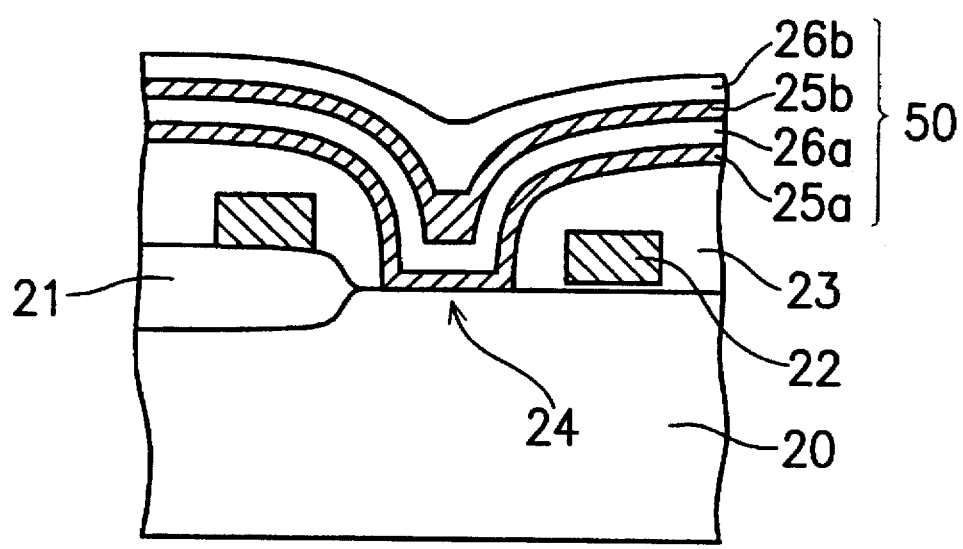
FIGS. 2A–2E are schematic cross-section diagrams showing the steps of process according to the present invention for fabricating a capacitor cell in DRAM chips.

FIGS. 2A–2E are schematic cross-section diagrams showing the steps of a process according to the present invention for fabricating a capacitor cell in a DRAM chip. The first step, as shown in FIG. 2A, is to prepare a silicon substrate 20. Using a convention process, there is formed on substrate 20 a field oxide layer 21 which defines the active region to form transistors serving as memory cells of the DRAM chip. Reference numeral 22 indicates the gate layer for the transistor. Next, the chemical-vapor deposition (CVD) is utilized to form an insulation layer 23 which in the presently preferred embodiment is a silicon dioxide layer covering the silicon substrate 20. A contact opening 24 is then formed by etching so as to expose part of the silicon substrate 20. Subsequently, there is formed a stacked structure 50 including a plurality of alternately formed polysilicon layers and insulation spacers, which in the preferred embodiment shown here are two layers of polysilicon layers 25a, 25b and two layers of insulation spacers 26a, 26b. The insulation spacers 26a, 26b are each a layer of silicon dioxide or silicon nitride. In the stacked structure 50, the bottom-most polysilicon layer 25a is implanted with impurities so as to increase the conductivity thereof and which comes in contact with the silicon substrate 20 via the contact opening 24.

In stacked structure 50 the number of polysilicon layers and insulation spacers is not limited to two as shown in the preferred embodiment disclosed here. The number can be three or more depending requirements. Increasing the number will add to the number of repetition of the deposition process to be performed and not to the level of difficulty in fabrication.

Figure 2B:
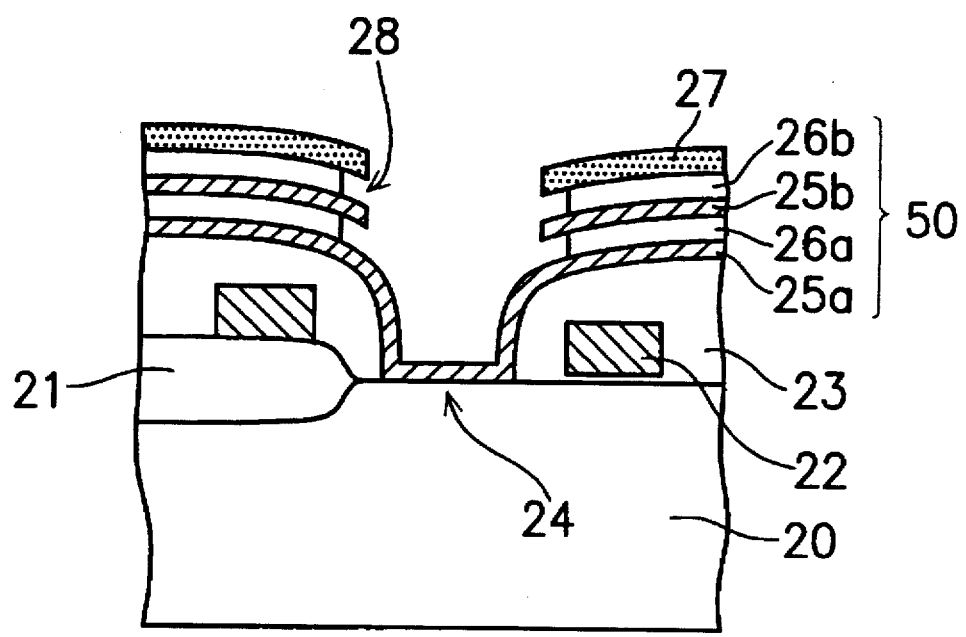

The next fabrication steps are shown in FIG. 2B. A photoresist layer 27 is coated on the stacked structure 50 and then a micro-lithographic process for pattern definition is performed to expose part of the stacked structure 50 where etching is to be performed. Next, dry etching, such as reactive ion etching (RIE), is used to etch away those areas of the stacked structure 50 not covered by the photoresist layer 27 until the bottom-most polysilicon layer 25a is exposed, whereby an opening 28 is formed. After that, the whole wafer is dipped in a suitable etching solution so as to inwardly etch away part of the insulation spacers 26a, 26b on the inner wall of the opening 28, whereby a plurality of grooves 28 are formed on the inner wall of the opening 28. In this etching process, if the insulation spacers 26a, 26b are silicon dioxide layers, the etching solution is hydrofluoric acid; and if silicon nitride, the etching solution is phosphoric acid.

Figure 2C:
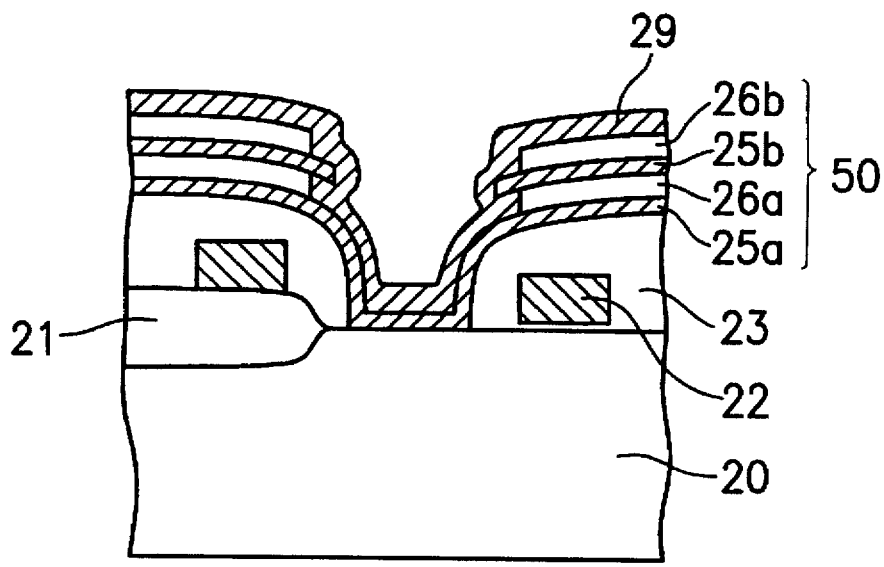
Figure 2D:
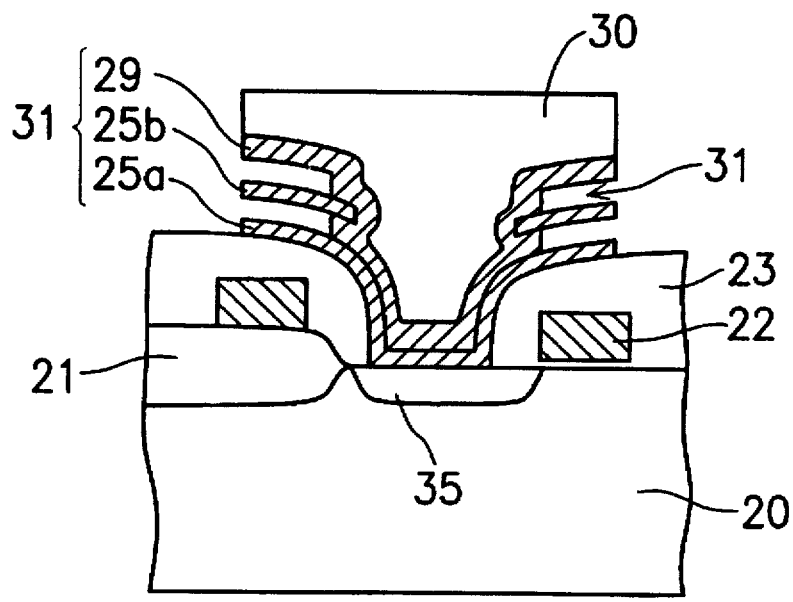

The next fabrication steps are shown in FIG. 2C. Photoresist layer 27 is removed. Then chemical-vapor deposition (CVD) is performed to form a second polysilicon layer 29 covering the exposed surfaces of the polysilicon layers 25a, 25b and the insulation spacers 26a, 26b in the stacked structure 50. Next, as shown in FIG. 2D, a photoresist layer 30 is coated on the areas where the capacitor cell is to be formed. The photoresist layer 30 serves as a mask to etch the polysilicon layer 29 as well as the polysilicon layers 25a, 25b and the insulation spacers 26a, 26b in the stacked structure 50. This defines a range for the capacitor cell where it is to be formed. By means of the polysilicon layer 29, all the polysilicon layers 25a, 25b in the stacked structure 50 are combined to form a bottom plate 31 for the capacitor cell. After that, a wet etching process is performed to remove each of the insulation spacers 26a, 26b in the stacked structure 50 while retaining the fin-like structured bottom plate 31.

Although the bottom plate 31 is similar to the conventional fin-structure, an improved capacitor cell is provided due to the forming of the grooves on the inner wall of the opening 28. The provision of these grooves not only strengthens the bonding between the polysilicon layer 29 and each of the two polysilicon layers 25a, 25b but also allows the capacitor cell to be made even smaller than that based on the conventional fin-structure.

Figure 2E:
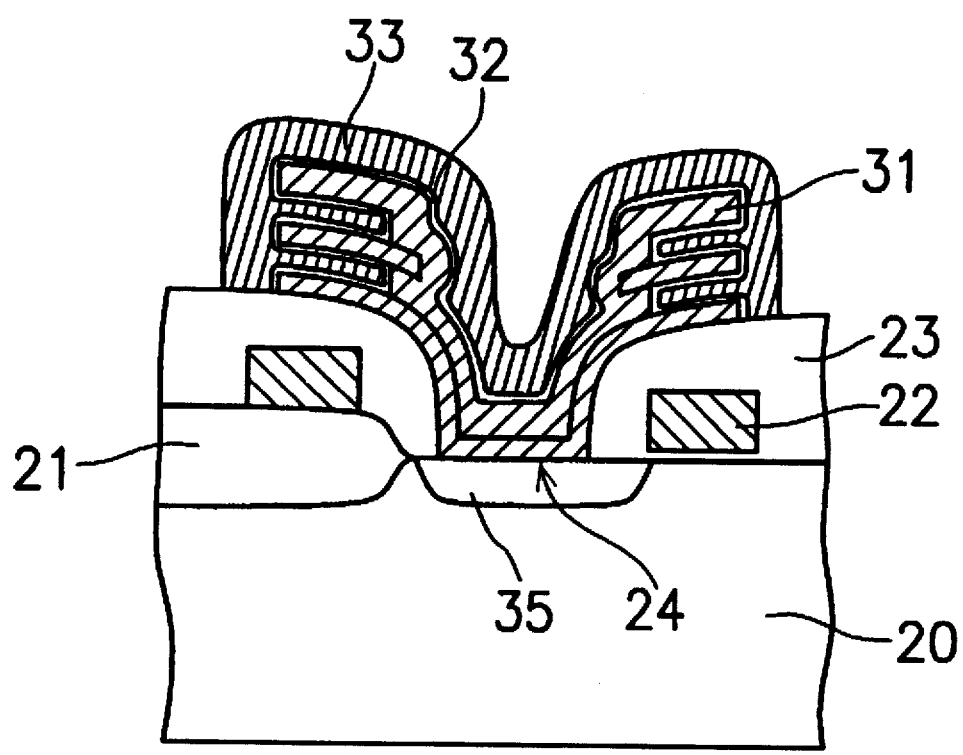

The final fabrication steps are shown in FIG. 2E, after the photoresist layer 30 is removed, a dielectric layer 32 of the ONO three-layer structure consisting of a silicon oxide layer (O), a silicon nitride layer (N), and a silicon oxide layer (O) is formed on the bottom plate 31. Heat treatment is used to form the dielectric layer 32 which also allows the impurities in the polysilicon layer 25a to be diffused through the contact opening 24 into the silicon substrate 10, whereby a contact region 35 is formed on the silicon substrate 20. Finally, a third polysilicon layer 33 is deposited on the dielectric layer 32 to serve as electrode on the capacitor cell.

Figure 1A:
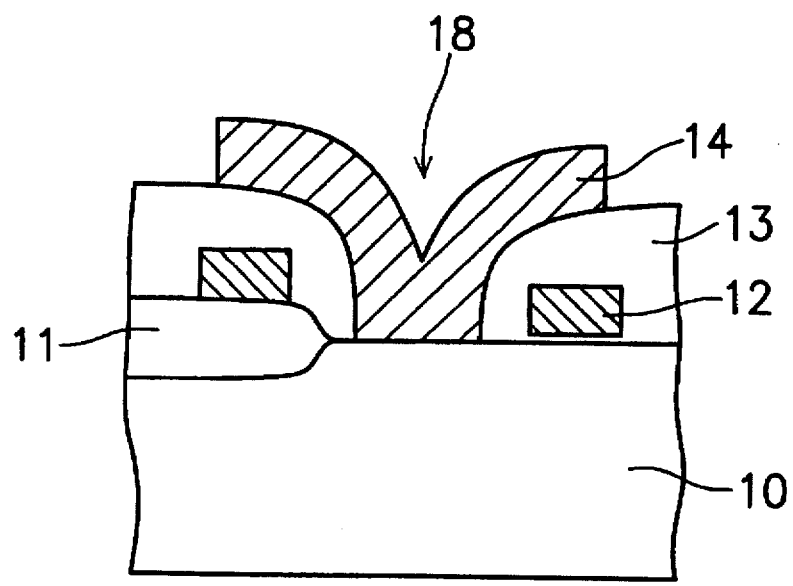
FIGS. 1A and 1B (Prior Art) are schematic cross-section diagrams showing the steps of a conventional process for fabricating a capacitor cell of a DRAM chip.
Figure 1B:
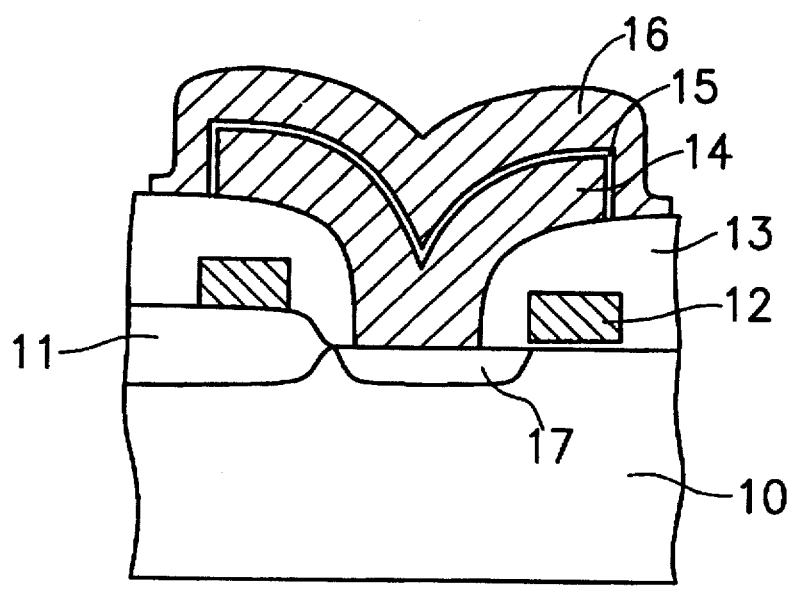

It should now be understood from the drawings and the foregoing description that the capacitor cell fabricated according to the present invention has a higher capacitance than a capacitor cell of the type shown in FIG. 1B, fabricated by a conventional process. Compared with the fin-like capacitor cell, the capacitor cell fabricated according to the present invention has stronger bonding and takes less space in the wafer. With the easiness in fabrication, the process according to the present invention is suitable for use in the fabrication of 16M DRAMs.

The present invention has been described with exemplary preferred embodiments. However, it is to be understood that the scope of the present invention need not be limited to the disclosed preferred embodiments. On the contrary, the claims are intended to cover various modifications and similar arrangements within the scope defined in the following appended claims. The scope of the claims should be accorded the broadest interpretation so as to encompass all such modifications and similar arrangements.

What is claimed is:

1. A process for fabricating a capacitor cell in a DRAM chip, comprising the steps of:

forming on a substrate a field oxide layer, a transistor cell, and an insulation layer, the insulation layer having a contact opening formed therethrough;

forming a stacked structure including a plurality of first polysilicon layers and insulation spacers alternately formed on the insulation layer, the bottom-most polysilicon layer in the stacked structure being implanted with impurities to increase conductivity thereof and coupled to the substrate via the contact opening;

etching through the plurality of first polysilicon layers and insulation spacers in the stacked structure until reaching the bottom-most polysilicon layer so as to form an opening therethrough;

wet etching away portions of the plurality of first polysilicon layers that are exposed on the inner wall of the opening so as to form a plurality of grooves on the inner wall of the opening;

forming a second polysilicon layer to the inner wall of the opening so as to cover the plurality of grooves formed thereon;

defining a range for the capacitor cell by etching the second polysilicon layer and the plurality of first polysilicon layers and insulation spacers in the stacked structure, whereby part of the second polysilicon layer that is connected to each of the first polysilicon layers in the stacked structure serves as a bottom plate for the capacitor cell;

removing each of the insulation spacers in the stacked structure while retaining the bottom plate;

heat treating to form a dielectric layer covering the bottom plate and also to allow the impurities in the bottom-most polysilicon layer in the stacked structure to be diffused through the contact opening into the substrate so as to form a contact region on the substrate; and forming a third polysilicon layer covering the dielectric layer to serve as a top plate for the capacitor cell.

2. A process according to claim 1, wherein the stacked structure includes two first polysilicon layers and two insulation spacers.

3. A process according to claim 1, wherein each insulation spacers comprises a layer of silicon dioxide.

4. A process according to claim 1, wherein each insulation spacer comprises a layer of silicon nitride.

5. A process according to claim 3, wherein the wet etching step comprises the step of wet etching using hydrofluoric acid as etching solution.

6. A process according to claim 4, wherein the wet etching step comprises the step of wet etching using phosphoric acid as etching solution.

7. A process according to claim 1, wherein the dielectric layer is a three-layer ONO structure comprising a silicon oxide layer, a silicon nitride layer, and a silicon oxide layer.

* * * * *